United States Patent
Huang et al.

(10) Patent No.: US 7,718,543 B2
(45) Date of Patent: May 18, 2010

(54) TWO STEP ETCHING OF A BOTTOM ANTI-REFLECTIVE COATING LAYER IN DUAL DAMASCENE APPLICATION

(75) Inventors: Zhilin Huang, San Jose, CA (US); Siyi Li, Fremont, CA (US); Gerardo A. Delgadino, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/608,611

(22) Filed: Dec. 8, 2006

(65) Prior Publication Data
US 2008/0138997 A1 Jun. 12, 2008

(51) Int. Cl.
*H01L 21/302* (2006.01)

(52) U.S. Cl. ............... 438/725; 438/714; 438/723; 216/64

(58) Field of Classification Search ............ 438/706, 438/710, 712, 714, 720, 723, 725; 216/58, 216/64, 67
See application file for complete search history.

(56) References Cited

U.S. PATENT DOCUMENTS

| | | | |
|---|---|---|---|
| 5,950,126 A | 9/1999 | Palviainen et al. | |
| 6,140,226 A | 10/2000 | Grill et al. | |
| 6,147,009 A | 11/2000 | Grill et al. | |
| 6,544,882 B1 * | 4/2003 | Liu et al. | 438/622 |
| 6,635,185 B2 * | 10/2003 | Demmin et al. | 216/64 |
| 7,125,806 B2 * | 10/2006 | Harada et al. | 438/706 |
| 2002/0102856 A1 | 8/2002 | Xia et al. | |
| 2002/0139771 A1 * | 10/2002 | Jiang et al. | 216/58 |
| 2002/0187627 A1 | 12/2002 | Yuang | |
| 2003/0068881 A1 | 4/2003 | Xia et al. | |
| 2003/0111181 A1 | 6/2003 | Wang et al. | |
| 2003/0228768 A1 | 12/2003 | Chae et al. | |
| 2004/0077175 A1 * | 4/2004 | Hsieh et al. | 438/694 |
| 2004/0157453 A1 | 8/2004 | Delgadino et al. | |
| 2004/0157486 A1 | 8/2004 | Brown | |
| 2004/0180556 A1 | 9/2004 | Chiang et al. | |
| 2005/0029229 A1 | 2/2005 | Chae et al. | |
| 2005/0051900 A1 * | 3/2005 | Liu et al. | 257/757 |
| 2005/0059234 A1 | 3/2005 | Bera et al. | |
| 2005/0266691 A1 | 12/2005 | Gu et al. | |

FOREIGN PATENT DOCUMENTS

JP 2001-284327 10/2001

OTHER PUBLICATIONS

Official Letter for Korean Patent Application No. 10-2007-0127403 dated Nov. 12, 2008 (APPM/10367KR).

* cited by examiner

*Primary Examiner*—Lan Vinh
(74) *Attorney, Agent, or Firm*—Patterson & Sheridan, LLP

(57) ABSTRACT

Methods for removing a BARC layer from a feature are provided in the present invention. In one embodiment, the method includes providing a substrate having a feature filled with a BARC layer in an etching chamber, supplying a first gas mixture comprising $NH_3$ gas into the chamber to etch a first portion of the BARC layer filling in the feature, and supplying a second gas mixture comprising $O_2$ gas into the etching chamber to etch the remaining portion of the BARC layer disposed in the feature.

20 Claims, 4 Drawing Sheets

TWO STEP ETCHING OF A BOTTOM ANTI-REFLECTIVE COATING LAYER IN DUAL DAMASCENE APPLICATION

BACKGROUND OF THE INVENTION

1. Field of the Invention

The present invention generally relates to semiconductor processing technologies and, more specifically, to methods for etching a bottom anti-reflective coating (BARC) layer in a dual damascene etching process.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. sub-micron dimensions), the materials used to fabricate such components contribute to their electrical performance. For example, metal interconnects with low resistance (e.g., copper and aluminum) provide conductive paths between the components on integrated circuits.

Copper is particularly advantageous for use in interconnect structures due to its desirable electrical properties. Copper interconnect system are typically fabricated using a damascene process in which trenches and vias are etched into dielectric layers. The trenches and vias are filled with copper which is then planarized using, for example, a chemical-mechanical planarization (CMP) process.

Copper interconnects are electrically isolated from each other by an insulating material. When the distance between adjacent metal interconnects and/or thickness of the insulating material has sub-micron dimensions, capacitive coupling may potentially occur between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g. dielectric constants less than about 4.0) are needed.

FIGS. 1A-1D illustrate an exemplary dual damascene structure formed by a "via-first" processing sequence. Referring first to FIG. 1A, a dielectric bulk insulating layer 110 and an underlying dielectric barrier layer 108 are stacked on another previously formed interconnect having a conductive layer 106 embedded in another dielectric bulk insulating layer 104 disposed on a substrate 102. An optional polish stop layer or anti-reflective coating (ARC) 112 may be disposed on the dielectric bulk insulating layer 110. The dielectric bulk insulating layer 110 is typically formed from a dielectric material having a dielectric constant lower than 4.0, such as FSG, polymer material, carbon containing silicon layer (SiOC), and the like.

A bottom anti-reflective coating (BARC) layer 114 is spin-applied to fill vias 128 formed by a via etching process and covers dielectric bulk insulating layer 110 before trench lithography. A photoresist layer 116 is disposed on the BARC layer 114 and patterned to define an opening 130 for forming trenches. A BARC etching process is performed to clear away a portion of the BARC layer 114 over the via opening 128 masked by the patterned photoresist layer 116 before etching the trenches, as shown in FIG. 1B. The BARC etching process is performed until the optional polish stop layer 112 defined by the photoresist layer 116 is exposed and the BARC layer 114 filling the via 128 is etched to a predetermined depth, as shown in FIG. 1B. Subsequently, a trench etching process is performed to etch the exposed polish stop layer 112 and the underlying dielectric bulk insulating layer 110 defined by the patterned photoresist layer 116, as shown in FIG. 1C. The trench etching process etches the dielectric bulk insulating layer 110 into a predetermined depth and defines trenches 122 in the dielectric bulk insulating layer 110. After the trench 122 has been formed, the remaining BARC layer 114 filling the via 128 and the photoresist layer 116 on the top surface of the dielectric bulk insulating layer 110 are removed from the substrate 102, thereby forming dual damascene structure on the substrate 102, as shown in FIG. 1D.

Typically, during the BARC 114 or photoresist layer 116 removal process, an oxygen containing plasma etch process is performed to react with the remaining BARC layer 114 and the photoresist layer 116 on the substrate 102, forming a carbon oxide polymer which is pumped out of the processing chamber. However, oxygen present plasma during the removal of BARC layer 114 and photoresist layer 116 may attack the exposed sidewall 120 and surface 126 of the trenches 122 and/or vias 128 formed in the dielectric bulk insulating layer 110. Oxygen may form a Si—O bond on the surface of the dielectric bulk insulating layer 110, which adversely affect the dielectric properties of the dielectric bulk insulating layer 110. For example, oxygen may accumulate on the sidewall 120 or exposed surface 126 of the low-k dielectric bulk insulating layer 110, and penetrate into the porous low-k dielectrics, thereby causing the carbon depletion at the film surface. Carbon depletion may cause the dielectric constant of the low-k material to undesirably increase, resulting in a "k loss" of the material dielectric properties. As a result, cross-talk and RC delay may increase after the BARC and photoresist etching process.

Furthermore, removal of the BARC and/or photoresist layer removal process may also leave contaminants 124, such as residual BARC, residual photoresist layer, impurities, organic or inorganic byproducts in the vias 128 and/or trenches 122. The contaminants 124 present in the vias 128 and/or trenches 122 may adversely effect the overall integration of the interconnection structure, resulting in poor device reliability and electrical performance.

Therefore, there is a need for an improved process for removing BARC in an interconnection structure.

SUMMARY OF THE INVENTION

Methods for removing a BARC layer from a feature are provided in the present invention. In one embodiment, the method includes providing a substrate having a feature filled with a BARC layer in an etching chamber, supplying a first gas mixture comprising $NH_3$ gas into the chamber to etch a first portion of the BARC layer filling in the feature, and supplying a second gas mixture comprising $O_2$ gas into the etching chamber to etch the remaining portion of the BARC layer disposed in the feature.

In another embodiment, the method for removing a BARC layer from a feature includes providing a substrate having features formed in a dielectric insulating layer and filled with a BARC layer in an etch chamber, supplying a first gas mixture comprising $NH_3$ into the chamber to etch a portion of the BARC layer filling in the feature, and supplying a second gas mixture comprising $O_2$ gas into the chamber to etch the remaining portion of the BARC layer in the feature.

In yet another embodiment, the method for removing a BARC layer from a feature includes providing a substrate having features formed in a dielectric insulating layer and filled with a BARC layer in an etch chamber, wherein the dielectric insulating layer has a dielectric constant less than 3.5, supplying a first gas mixture having $NH_3$ gas at between about 50 sccm and about 1000 sccm into the etch chamber to etch a portion of the BARC layer filling in the feature, and supplying a second gas mixture comprising $O_2$ gas at between about 50 sccm and about 500 sccm into the etch chamber to etch the remaining portion of the BARC layer in the feature.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods for two step etching of a BARC layer in a dual damascene structure. The methods preserve the quality of the low-k dielectric film while maintaining a high removal rate by using different gas mixtures at separate BARC layer etching steps in a dual damascene fabrication process.

The etch process described herein may be performed in any suitable plasma etch chamber. One such etch chamber is the ENABLER® processing chamber, available from Applied Materials, Inc., of Santa Clara, Calif. It is contemplated that the other etch reactors, including those from other manufacturers, may be adapted to benefit from the invention.

Figure 1A:
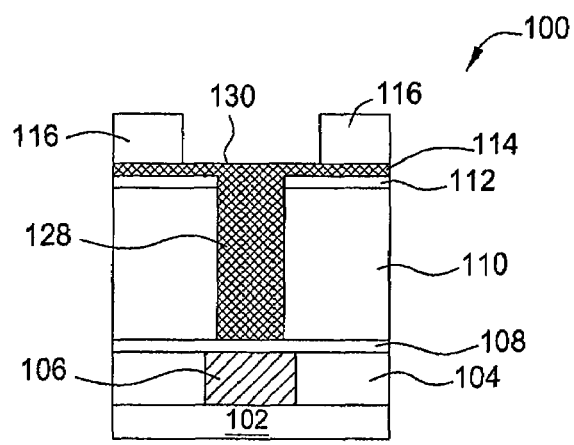
FIGS. 1A-1D are a sequence of sectional views of an exemplary dual damascene fabrication process.
Figure 1B:
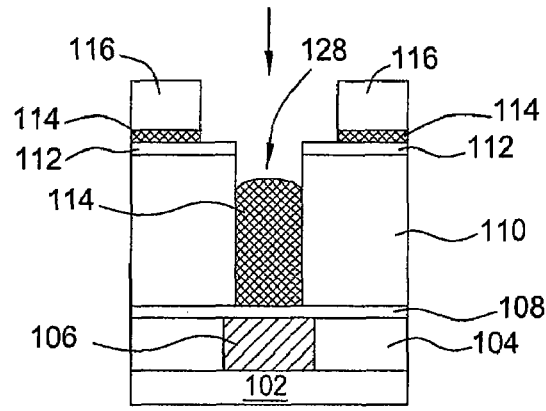
Figure 1C:
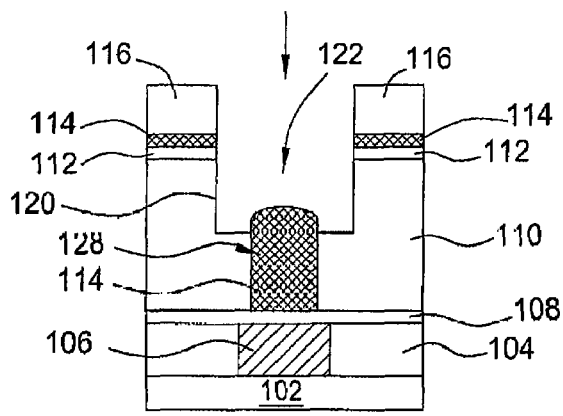
Figure 1D:
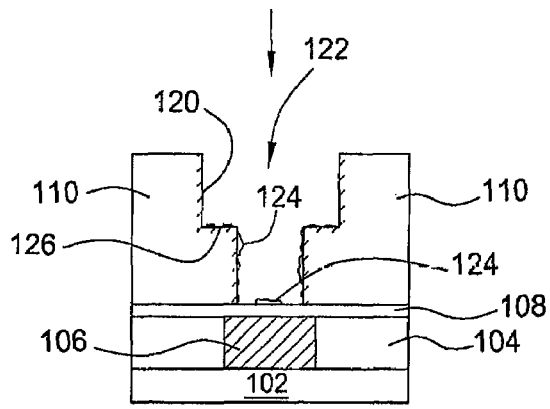
Figure 2:
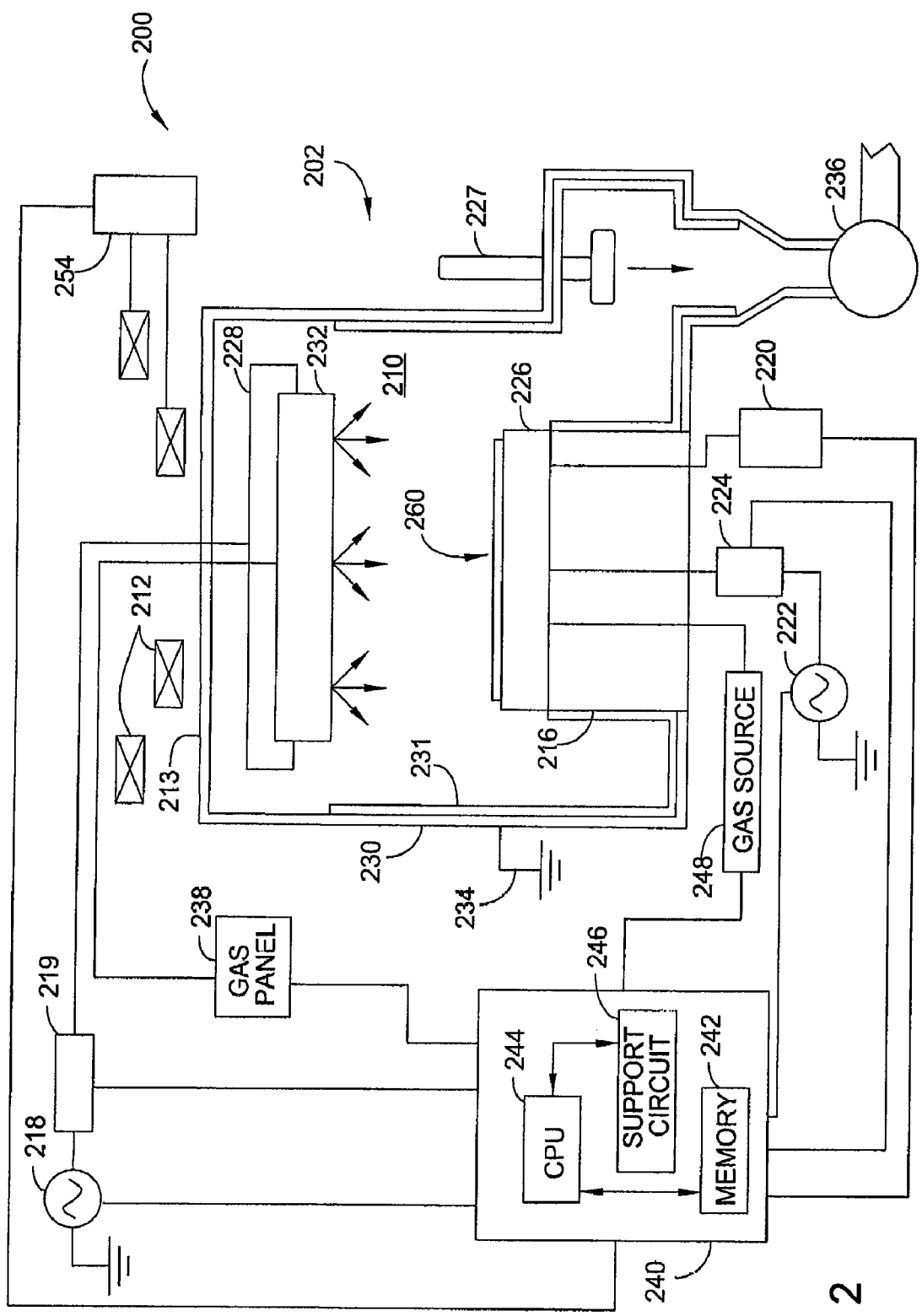
FIG. 2 is a schematic cross-sectional view of a plasma etching chamber used according to one embodiment of the invention.

FIG. 2 depicts a schematic cross-sectional view of one embodiment of a plasma etch system 202 suitable for performing one or more steps of the invention. The plasma etch system 202 may include a process chamber body 210 having a conductive chamber wall 230 and a lid 213. The temperature of the conductive chamber wall 230 is controlled using liquid-containing conduits (not shown) that are located in and/or around the conductive chamber wall 230. The conductive chamber wall 230 is connected to an electrical ground 234. A liner 231 is disposed in the process chamber body 210 to cover the interior surfaces of the conductive chamber wall 230. The liner 231 serves as a surface protection layer that protects the interior surface of the chamber wall 230 of the process chamber body 210. In one embodiment, the liner 231 may be fabricated by ceramic materials including $Al_2O_3$, AlN, silicon carbide, $Y_2O_3$, and the like.

The process chamber body 210 has a vacuum vessel that is coupled through a throttle valve 227 to a vacuum pump 236. A support pedestal 216 is disposed in the bottom of the process chamber body 210 to support a substrate 260 positioned thereon during processing. The support pedestal 216 may include an electrostatic chuck 226 for retaining the substrate 260. A DC power supply 220 is utilized to control the power supplied to the electrostatic chuck 226. The support pedestal 216 is coupled to a radio frequency (RF) bias power source 222 through a matching network 224. The bias power source 222 is generally capable of producing an RF signal having a tunable frequency of from about 50 kHz to about 60 MHz, and a bias power of about 0 to about 5,000 Watts. The bias power source 222 may provide a signal at multiple frequencies, such as about 13.56 MHz and about 2 MHz. Optionally, the bias power source 222 may be a DC or pulsed DC source.

The temperature of the substrate 260 is at least partially controlled by regulating the temperature of the support pedestal 216. In one embodiment, the support pedestal 216 includes a cooling plate (not shown) having channels for flowing a coolant. In addition, a backside gas, such as helium (He) gas, provided from a gas source 248, fits provided into channels disposed between the back side of the substrate 260 and grooves (not shown) formed in the surface of the electrostatic chuck 226. The backside gas provides efficient heat transfer between the pedestal 216 and the substrate 260. The electrostatic chuck 226 may also include a resistive heater (not shown) disposed within the chuck 226 to heat the substrate 260 during processing. In one embodiment, the substrate 260 is maintained at a temperature of between about 10 to about 500 degrees Celsius.

A showerhead 232 is mounted to a lid 213 of the process chamber body 210 in a spaced-apart relation to the substrate pedestal 116 facing toward the substrate 260. A gas panel 238 is fluidly coupled to a plenum (not shown) defined between the showerhead 232 and the lid 213. The showerhead 232 includes a plurality of holes to allow gases provided to the plenum from the gas panel 238 to enter the process chamber body 210. The holes in the showerhead 232 may be arranged in different zones such that various gases can be released into the chamber body 210 with different volumetric flow rates.

The showerhead 232 and/or an upper electrode 228 positioned proximate thereto is coupled to a RF plasma power source 218 through an impedance transformer 219 (e.g., a quarter wavelength matching stub). The RF power source 218 is generally capable of producing an RF signal having a tunable frequency of about 50 kHz to about 160 MHz and a source power of about 0 to about 5,000 Watts. The RF plasma power source 218 may provide a signal at multiple frequencies, such as about 13.56 MHz or about 2 MHz.

The plasma etch system 202 may also include one or more coil segments or magnets 212 positioned exterior to the chamber wall 230, near the chamber lid 213. Power to the coil segment(s) 212 is controlled by a DC power source or a low-frequency AC power source 254.

During substrate processing, gas pressure within the interior of the chamber body 210 is controlled using the gas panel 238 and the throttle valve 227. In one embodiment, the gas pressure within the interior of the chamber body 210 is maintained at about 0.1 to about 999 mTorr.

A controller 240, including a central processing unit (CPU) 244, a memory 242, and support circuits 246, is coupled to the various components of the system 202 to facilitate control of the processes of the present invention. The memory 242 can be any computer-readable medium, such as random access memory (RAM), read only memory (ROM), floppy disk, hard disk, or any other form of digital storage, local or remote to the system 202 or CPU 244. The support circuits 246 are coupled to the CPU 244 for supporting the CPU 244 in a conventional manner. These circuits include cache, power supplies, clock circuits, input/output circuitry and subsystems, and the like. A software routine or a series of program instructions stored in the memory 242, when executed by the CPU 244, causes the plasma etch system 202 to perform an etch process of the present invention.

FIG. 2 only shows one exemplary configuration of various types of plasma etching chambers that can be used to practice the invention. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained solely by the bias power. The plasma density can be enhanced by a magnetic field applied to the vacuum chamber using electromagnets, such as the magnets 212, driven with a low frequency (e.g., 0.1-0.5 Hertz) AC current source or a DC source. In other applications, the plasma may be generated in a different chamber from the one in which the substrate is located, e.g., remote plasma source, and subsequently guided into the chamber using techniques known in the art.

Figure 3:
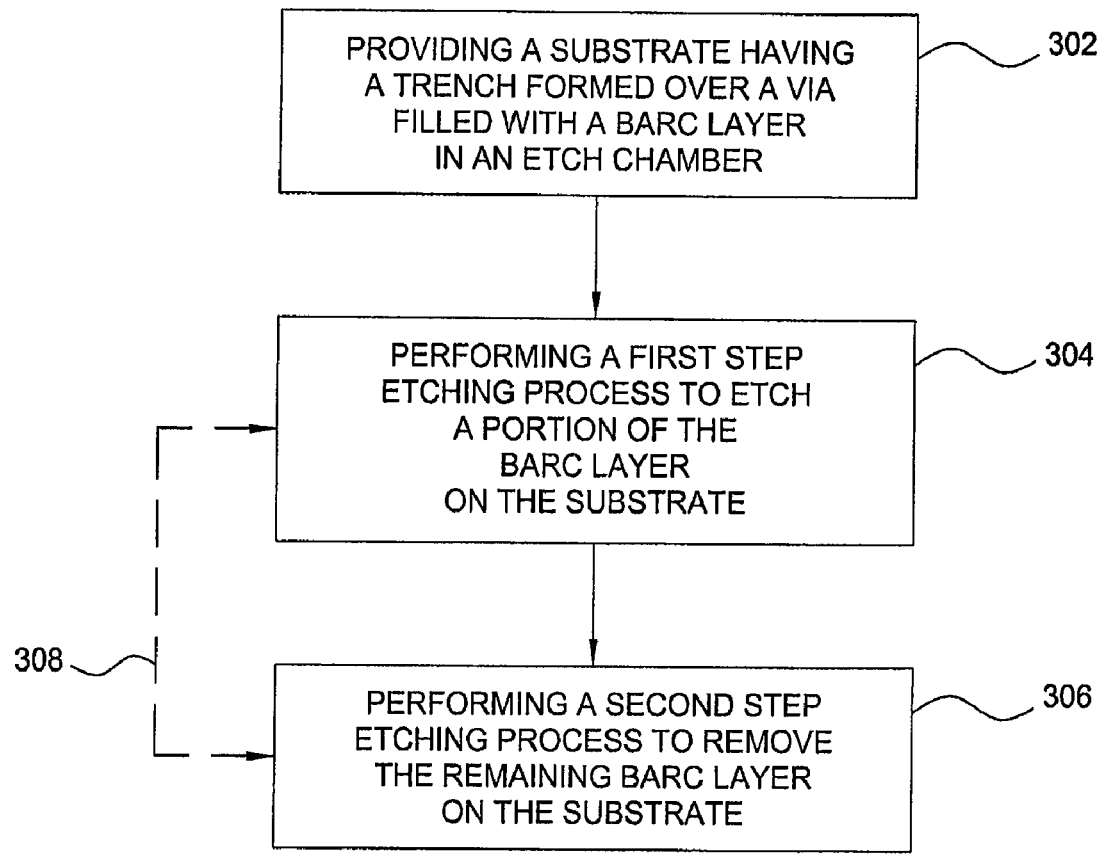
FIG. 3 is a process flow diagram illustrating one embodiment of a method for two step etching method for etching a BARC layer and/or a photoresist layer in a dual damascene structure.
Figure 4A:
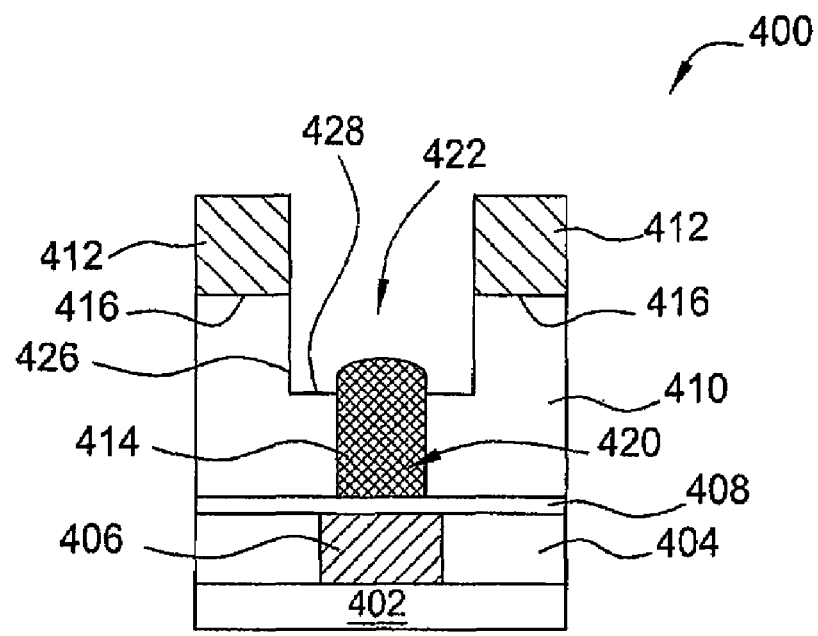
FIGS. 4A-4B are a sequence of sectional views of a dual damascene fabrication process according to one embodiment of the present invention.
Figure 4B:
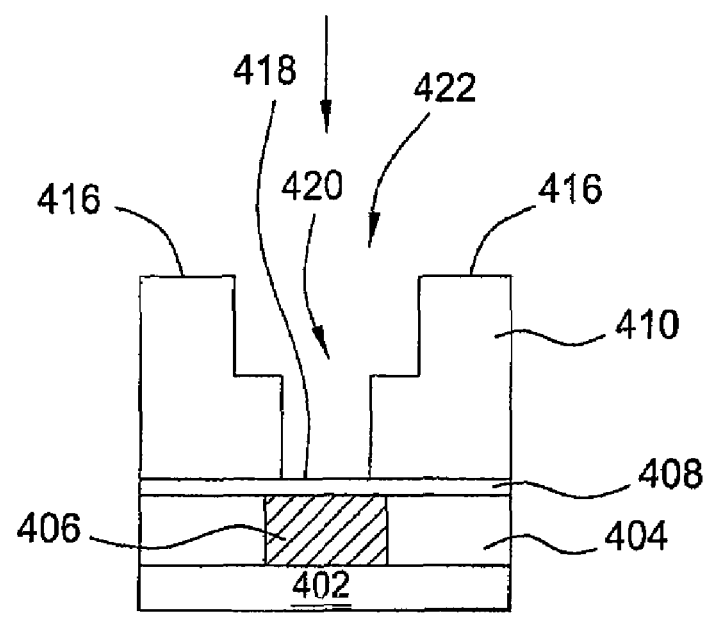

FIG. 3 illustrates a flow diagram of a BARC removal process 300 suitable for use in a dual damascene fabrication process according to one embodiment of the invention. FIGS. 4A-4B are sequential schematic cross-sectional views illustrating different stages of process 300 illustrating the BARC removal process 300. The process 300 may be stored in memory 242 as instructions that when executed by the controller 240 cause the process 300 to be performed in the chamber 202.

The process 300 begins at step 302 by providing a substrate having a film stack suitable for fabricating a dual damascene structure. As shown in FIG. 4A, the film stack has been etched to form a dual damascene structure 400 having a trench 422 over a via 420. The film stack includes a dielectric bulk insulating layer 410 disposed on a dielectric barrier layer 408 stacked on an underlying dielectric insulating layer 404. In embodiments the dielectric barrier layer 408 not present, the dielectric bulk insulating layer 410 may be directly disposed on the underlying dielectric insulating layer 404. The underlying dielectric insulating layer 404 is disposed on a substrate 402 and has at least a conductive layer 406, such as a copper line, embedded therein.

In one embodiment, the dielectric insulating layer 410 is a dielectric material having a dielectric constant less than 4.0, such as less than 3.5. Examples of suitable materials include carbon-doped silicon oxides (SiOC), such as BLACK DIAMOND® dielectric material available from Applied Materials, Inc., and other polymers, such as polyamides. The dielectric barrier layer 408 is selected from a material having a dielectric constant of about 5.5 or less. In one embodiment, the dielectric barrier layer 408 is a carbon containing silicon layer (SiC), a nitrogen doped carbon containing silicon layer (SiCN), or the like. For example, the dielectric barrier layer 408 may be a BLOK® dielectric material, available from Applied Materials Inc.

The trench 422 is formed in the dielectric insulating layer 410 is open through a patterned photoresist layer 412. A BARC layer 414 filling in the via 420 is exposed at the bottom of the trench 422. In one embodiment, the photoresist layer 412 may be conventional carbon-based, organic or polymeric materials used to pattern integrated circuit. The BARC 414 may extend from the via 420 to a height beyond a bottom surface 428 of the trench 422, thereby slightly protruding out of the via 420. The BARC layer 414 may comprise, for example, organic materials such as polyamides and polysulfide typically having hydrogen and carbon containing elements, or inorganic materials, such as silicon nitride, silicon oxynitride, silicon carbide, and the like. In the embodiment depicted in FIG. 4A, the BARC layer 414 is an organic material spun-on the substrate 402. In another exemplary embodiment, the BARC layer 414 may be coated, deposited, or filled in the vias in any other suitable manner.

The patterned photoresist layer 412 transfers a predetermined pattern and/or feature in the dielectric insulating layer 410. During the process of predetermined pattern and/or feature formation, the patterned photoresist layer 412 may be consumed or trimmed, leaving a portion of the patterned photoresist layer 412 on the upper surface 416 of the dielectric insulating layer 410. Alternatively, the patterned photoresist layer 412 may be substantially removed, thereby exposing the upper surface 416 of the dielectric insulating layer 410. In embodiments depicted in FIG. 4A, a portion of the patterned photoresist layer 412 is remained on the dual damascene structure 400 after predetermined pattern and/or feature are transferred in the dielectric insulating layer 410 to for the trench 422. In embodiments that the photoresist layer 412 is not present, the two step etching process may be performed to remove the BARC layer 414 remained in the vias 420.

At step 304, a first etching step is performed to initially etch a portion of the BARC layer 414 filling the via 420 and exposed through the trench 422 by supplying a first gas mixture in the etching chamber 202. If a portion of the patterned photoresist layer 412 may be remained on the substrate surface, the first BARC etching step may also etch the patterned photoresist layer 412.

In one embodiment, the first gas mixture supplied into the etching chamber 202 contains ammonia gas ($NH_3$). The first gas mixture is used to remove organic polymers and photoresist crust that may be generated from the previous etching processes and/or present on the substrate surface. The hydrogen element in the first gas mixture cleans the organic residues by forming volatile hydrogen carbon compounds which are pumped out of the etching system 202 without damaging the substrate surface. The first gas mixture may also passivate the sidewall 426 or exposed surface 428 of the dielectric insulating layer 410, thereby preventing the underlying low-k dielectric substrate from k value shift and dielectric constant increase. The first gas mixture may also purge and flush out the residual gas, e.g., fluorine containing gas, from the previous etching process remaining in the etching chamber 202, thereby preventing defect generation or chemical reaction with residual fluorine chemistry which may further attack dielectric insulating layer surface.

In one embodiment, the BARC layer 414 and/or the patterned photoresist layer 412 is first etched by forming a plasma from the first gas mixture containing $NH_3$ gas. The BARC layer 414 and/or the patterned photoresist layer 412 may be etched in an etch chamber, such as the etching chamber 202 described in FIG. 2, or in other suitable reactors.

Several process parameters are regulated at step 304 while the first gas mixture is supplied into the etching system 202. In one embodiment, a pressure of the gas mixture in the etch reactor is regulated between about 5 mTorr to about 300 mTorr, and the substrate temperature is maintained between about −10 degrees Celsius and about 55 degrees Celsius. RF source power may be applied at a power of about 150 Watts to about 2000 Watts. The NH$_3$ gas may be flowed at a flow rate between about 50 sccm and about 1000 sccm, such as about 100 sccm and about 800 sccm. Other inert gas, such as N$_2$, Ar, He gas, may be flowed and supplied in the first gas mixture at a flow rate between about 50 sccm to about 1000 sccm.

In one embodiment, the first etching step may be terminated by expiration of a predefined time period. For example, the first etching step is terminated by processing between about 20 seconds to about 200 seconds. In another embodiment, the first BARC etching step may be terminated by other suitable method, for example, by monitoring optical emission or by other indicator.

At step 306, a second etching step is performed to etch and remove the remaining portion of the BARC layer 414 filling the via 402. The second step 306 also removes any patterned photoresist layer 412 remaining on the upper surface 416 of the dielectric insulating layer 410. The second etching step is performed using a second gas mixture supplied into the etching chamber 202. In one embodiment, the second gas mixture includes O$_2$ gas. The second gas mixture containing O$_2$ gas forms volatile polymers with the residuals and byproducts from the first etching step 304 and reacts with the remaining BARC 414 and photoresist layer 412 on the substrate 402, thereby efficiently removing the residuals, byproducts, remaining BARC 414 and photoresist layer 412 from the substrate 402 out of the etching system 202. The oxygen element In the second gas mixture provides a high etching rate and polymer removal rate that not only advantageously promotes removal of the residuals and contaminants but also cleans away the residuals and byproducts that may not be completely removed during the first etching process.

In one embodiment, the BARC layer 414 and/or the photoresist layer 412 is etched by forming a plasma from the second gas mixture containing O$_2$. The BARC layer and/or the photoresist layer 412 may be etched in an etch system, such as the etch system 202 described in FIG. 2, or in other suitable reactors.

Several process parameters are regulated at step 306 while the second gas mixture is supplied into the system 202. In one embodiment, a pressure of the gas mixture in the etch reactor is regulated between about 5 mTorr to about 50 mTorr, and the substrate temperature is maintained between about −10 degrees Celsius and about 55 degrees Celsius. RF source power may be applied at a power of about 150 Watts to about 2000 Watts. The O$_2$ gas may be flowed at a flow rate between about 50 sccm to about 500 sccm. The etching time may be processed at between about 20 seconds and about 200 seconds, such as between about 10 seconds to about 60 seconds.

The second etching step 306 is terminated by expiration of a predefined time period. For example, the second BARC etching step may be terminated by processing between about 10 seconds to about 60 seconds. In one embodiment, the second etching step 306 may also be configured to have a process time substantially equal to the first etching step 304, as described above. Alternatively, the process time of the first etching step 304 and the second etching step 306 may be configured to have a time period ratio between about 1:1 to about 4-1. In another embodiment, the second etching step 306 is terminated by monitoring optical emissions or by other indicator that indicates that the BARC layer 414 and/or the photoresist layer 412 has been completely removed from the substrate 402 or the upper surface 416 of the dielectric insulating layer 410 and a bottom surface 418 in the via 420 has been exposed, as shown in FIG. 4B.

Since the sidewall and surface of the dielectric Insulating layer 410 are passivated and protected by the polymer formed from exposure to the first gas mixture at step 304, the second gas mixture 306 mainly etches the residuals, byproducts, and the remaining BARC layer 414 and/or the photoresist layer 412 disposed on the substrate without adversely affecting or etching the underlying structures on the substrate, such as the dielectric insulating layer 410. Furthermore, as the second gas mixture provided at the second etching step 306 reacts mainly with the BARC layer 414 and/or the photoresist layer 412, the second etching step 306 advantageously and efficiently removes both organic and/or inorganic materials from the substrate.

The two step etching process as described at step 304 and step 306 may be repeatedly and consecutively performed on the substrate as indicated by the loop 308 depicted in FIG. 3. Alternatively, the two steps etching process described at step 304 and step 306 may be performed in the reverse order. For example, the etching step as described at step 306 may be performed first, then followed the etching process as described at step 304.

The dual damascene structure 400 as depicted in FIG. 4 only shows an exemplary embodiment that may be utilized to perform the two step etching process as described in the present invention. Other structures, such as single damascene structure, via only structure, trench-first structure, and the like, having a BARC layer disposed thereon may also be utilized to perform the two step etching process as described above. The method may also be utilized to etch BARC layer found in other substrates.

Thus, the present invention provides a two step etching method for etching a BARC layer with high removal rate and clean efficiency. The method advantageously facilitates removal of the BARC layer, photoresist layer, and associated residuals and byproducts from trenches and/or vias in a dual damascene structure without adversely damage underlying dielectric materials disposed on the substrate. The two step etching process also provides good sidewall and/or surface protection.

While the foregoing is directed to embodiments of the present invention, other and further embodiments of the invention may be devised without departing from the basic scope thereof, and the scope thereof is determined by the claims that follow.

What is claimed is:

1. A method for removing a BARC layer from a feature formed in a dual damascene structure, comprising:
    providing a substrate having a feature filled with a BARC layer in an etching chamber, wherein the feature includes a trench connected to a via defined in a dielectric bulk insulating layer, wherein the BARC layer is an organic material filled within the via;
    supplying a first gas mixture comprising NH$_3$ gas into the chamber to etch a first portion of the BARC layer filling in the feature while providing sidewall protection of the dielectric bulk insulating layer; and
    supplying a second gas mixture comprising O$_2$ gas into the etching chamber to etch the remaining portion of the BARC layer disposed in the feature, wherein a process time for etching the portion of the BARC layer in the presence of the first gas mixture relative to a process time for etching the remaining portion of the BARC layer has a ratio of between about 1:1 and about 4:1.

2. The method of claim 1, wherein the step of supplying the first gas mixture further comprises:
    flowing NH$_3$ into the etching chamber having at a flow rate between 50 sccm and 1000 sccm.

3. The method of claim 1, wherein the step of supplying the first gas mixture further comprises:

maintaining a process pressure at between about 5 mTorr to about 300 mTorr.

4. The method of claim 1, wherein the step of supplying the first gas mixture further comprises:
controlling substrate temperature between about −10 degrees Celsius to about 55 degrees Celsius.

5. The method of claim 1, wherein the step of supplying the first gas mixture further comprises:
applying a plasma power at between about 150 Watts to about 2000 Watts.

6. The method of claim 1, wherein the step of supplying the first gas mixture further comprises:
etching the first portion of the BARC layer filling in the features at a process time between about 20 seconds and about 200 seconds.

7. The method of claim 1, wherein the step of supplying the second gas mixture further comprises:
flowing $O_2$ gas into the etching chamber at a flow rate between 50 sccm and 500 sccm.

8. The method of claim 1, wherein the step of supplying the second gas mixture further comprises:
maintaining a process pressure at between about 5 mTorr to about 50 mTorr.

9. The method of claim 1, wherein the step of supplying the second gas mixture further comprises:
controlling substrate temperature between about −10 degrees Celsius to about 55 degrees Celsius.

10. The method of claim 1, wherein the step of supplying the second gas mixture further comprises:
applying a plasma power at between about 150 Watts to about 2000 Watts.

11. The method of claim 1, wherein the step of supplying the second gas mixture further comprises:
etching the remaining portion of the BARC layer filling in the features at a process time between about 10 seconds and about 60 seconds.

12. The method of claim 1, wherein the damascene structure includes a dielectric insulating layer having a dielectric constant less than 3.5.

13. The method of claim 1, wherein the damascene structure includes a dielectric insulating layer comprising carbon doped silicon oxide.

14. The method of claim 1, wherein the step of providing further comprises:
providing the substrate having a photoresist layer disposed on an upper surface of the substrate.

15. The method of claim 14, wherein the first gas mixture and the second gas mixture supplied into the etching chamber etch the photoresist layer while etching the BARC layer.

16. A method for removing a BARC layer from a feature, comprising:
providing a substrate having a via formed in a dual damascene structure in an etch chamber, wherein the via is formed in a dielectric insulating layer under a trench and filled with a BARC layer, the BARC layer comprising an organic material;
supplying a first gas mixture comprising $NH_3$ into the chamber to etch a portion of the BARC layer filling in the via while providing sidewall protection of the dielectric insulating layer; and
supplying a second gas mixture comprising $O_2$ gas into the chamber to etch the remaining portion of the BARC layer in the via, wherein a process time for etching the portion of the BARC layer in the presence of the first gas mixture relative to a process time for etching the remaining portion of the BARC layer has a ratio of between about 1:1 and about 4:1.

17. The method of claim 16, wherein the step of supplying the first gas mixture further comprising:
flowing the $NH_3$ gas at a rate between about 50 sccm to about 1000 sccm.

18. The method of claim 16, wherein the step of supplying the second gas mixture further comprising:
flowing the $O_2$ gas at a rate between about 50 sccm to about 500 sccm.

19. The method of claim 16, wherein the dielectric insulating layer has a dielectric constant less than 3.5.

20. A method for removing a BARC layer from a feature, comprising:
providing a substrate having a via formed within a dielectric insulating layer in a dual damascene structure and filled with a BARC layer in an etch chamber, wherein the dielectric insulating layer has a dielectric constant less than 3.5, the BARC layer comprising an organic material;
supplying a first gas mixture having $NH_3$ gas at between about 50 sccm and about 1000 sccm into the etch chamber to etch a portion of the BARC layer filling in the via while providing sidewall protection of the dielectric insulating layer; and
supplying a second gas mixture comprising $O_2$ gas at between about 50 sccm and about 500 sccm into the etch chamber to etch the remaining portion of the BARC layer in the via, wherein a process time for etching the portion of the BARC layer in the presence of the first gas mixture relative to a process time for etching the remaining portion of the BARC layer has a ratio of between about 1:1 and about 4:1.

* * * * *

UNITED STATES PATENT AND TRADEMARK OFFICE
CERTIFICATE OF CORRECTION

PATENT NO. : 7,718,543 B2  Page 1 of 1
APPLICATION NO. : 11/608611
DATED : May 18, 2010
INVENTOR(S) : Huang et al.

It is certified that error appears in the above-identified patent and that said Letters Patent is hereby corrected as shown below:

Column 7, Line 27, please delete "In" and insert --in-- therefor;

Column 7, Line 58, please delete "4-1" and insert --4:1-- therefor;

Column 7, Line 65, please delete "Insulating" and insert --insulating-- therefor.

Signed and Sealed this

Seventeenth Day of August, 2010

David J. Kappos
*Director of the United States Patent and Trademark Office*